(12) United States Patent
Ishibashi

(10) Patent No.: US 9,761,601 B2
(45) Date of Patent: Sep. 12, 2017

(54) SEMICONDUCTOR MEMORY DEVICE AND METHOD FOR MANUFACTURING SAME

(71) Applicant: Toshiba Memory Corporation, Minato-ku (JP)

(72) Inventor: Shota Ishibashi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 9 days.

(21) Appl. No.: 14/734,379

(22) Filed: Jun. 9, 2015

(65) Prior Publication Data

US 2016/0225783 A1    Aug. 4, 2016

Related U.S. Application Data

(60) Provisional application No. 62/110,113, filed on Jan. 30, 2015.

(51) Int. Cl.
| | |
|---|---|
| *H01L 27/115* | (2017.01) |
| *H01L 27/1157* | (2017.01) |
| *H01L 27/11573* | (2017.01) |
| *H01L 27/11575* | (2017.01) |
| *H01L 27/11582* | (2017.01) |

(52) U.S. Cl.
CPC .... *H01L 27/1157* (2013.01); *H01L 27/11573* (2013.01); *H01L 27/11575* (2013.01); *H01L 27/11582* (2013.01)

(58) Field of Classification Search
CPC .......... H01L 27/11568; H01L 27/1157; H01L 27/11573; H01L 27/11578; H01L 29/4234; H01L 29/66833; H01L 29/792; H01L 29/66787
See application file for complete search history.

(56) References Cited

U.S. PATENT DOCUMENTS

| | | | |
|---|---|---|---|
| 8,335,111 B2 | 12/2012 | Fukuzumi et al. | |
| 2011/0233648 A1* | 9/2011 | Seol | H01L 21/32137 257/324 |
| 2012/0008400 A1* | 1/2012 | Fukuzumi | G11C 16/0483 365/185.18 |
| 2012/0140562 A1* | 6/2012 | Choe | H01L 27/1157 365/185.18 |
| 2013/0069152 A1* | 3/2013 | Lee | H01L 29/66833 257/335 |

(Continued)

*Primary Examiner* — Victoria K Hall
(74) *Attorney, Agent, or Firm* — Oblon, McClelland, Maier & Neustadt, L.L.P.

(57) ABSTRACT

A semiconductor memory device having one embodiment which includes a substrate; a stacked body provided on the substrate and including a plurality of electrode layers separately stacked; a first upper layer gate provided on the stacked body; an interlayer insulating layer provided on the first upper layer gate; an insulating part continuously provided from the first upper layer gate to the substrate and extending in a first direction parallel to a major surface of the substrate; a second upper layer gate; a semiconductor part; a charge storage film; and a semiconductor layer provided from an upper end of the semiconductor part to a portion of the semiconductor part reaching the second upper layer gate. The second upper layer gate is provided on the interlayer insulating layer and the insulating part, and extends on a first surface parallel to the major surface.

9 Claims, 19 Drawing Sheets

(56) References Cited

U.S. PATENT DOCUMENTS

| | | | |
|---|---|---|---|
| 2013/0075805 A1* | 3/2013 | Sato | H01L 29/66833 257/324 |
| 2013/0115761 A1* | 5/2013 | Kim | H01L 21/04 438/510 |
| 2013/0341703 A1 | 12/2013 | Shinohara et al. | |
| 2014/0001544 A1 | 1/2014 | Sato et al. | |
| 2014/0035026 A1* | 2/2014 | Jang | H01L 29/792 257/324 |
| 2014/0054676 A1* | 2/2014 | Nam | H01L 29/7926 257/324 |
| 2014/0063936 A1* | 3/2014 | Shim | H01L 27/11582 365/184 |
| 2014/0070302 A1* | 3/2014 | Yoo | H01L 27/1157 257/324 |
| 2014/0166963 A1* | 6/2014 | Lee | H01L 21/02532 257/4 |
| 2015/0123189 A1* | 5/2015 | Sun | H01L 27/11556 257/321 |
| 2015/0270280 A1* | 9/2015 | Simsek-Ege | H01L 27/11582 257/66 |
| 2015/0340370 A1* | 11/2015 | Kim | H01L 27/11578 365/185.18 |
| 2016/0104717 A1* | 4/2016 | Lu | G11C 16/0483 365/185.22 |

\* cited by examiner

SEMICONDUCTOR MEMORY DEVICE AND METHOD FOR MANUFACTURING SAME

This application is based upon and claims the benefit of priority from U.S. Provisional Patent Application 62/110,113 filed on Jan. 30, 2015; the entire contents of which are incorporated herein by reference.

FIELD

Embodiments described herein relate generally to a semiconductor memory device and a method for manufacturing same.

BACKGROUND

A three-dimensional structure memory device is proposed in which a memory hole is formed in a stacked body in which a plurality of electrode layers each functioning as a control gate in a memory cell are stacked through insulating layers, and a silicon body as a channel is provided on a side wall of the memory hole through a charge storage film.

With miniaturization of the three-dimensional device, improvement of machining accuracy and high reliability are required.

DETAILED DESCRIPTION

Figure 1:
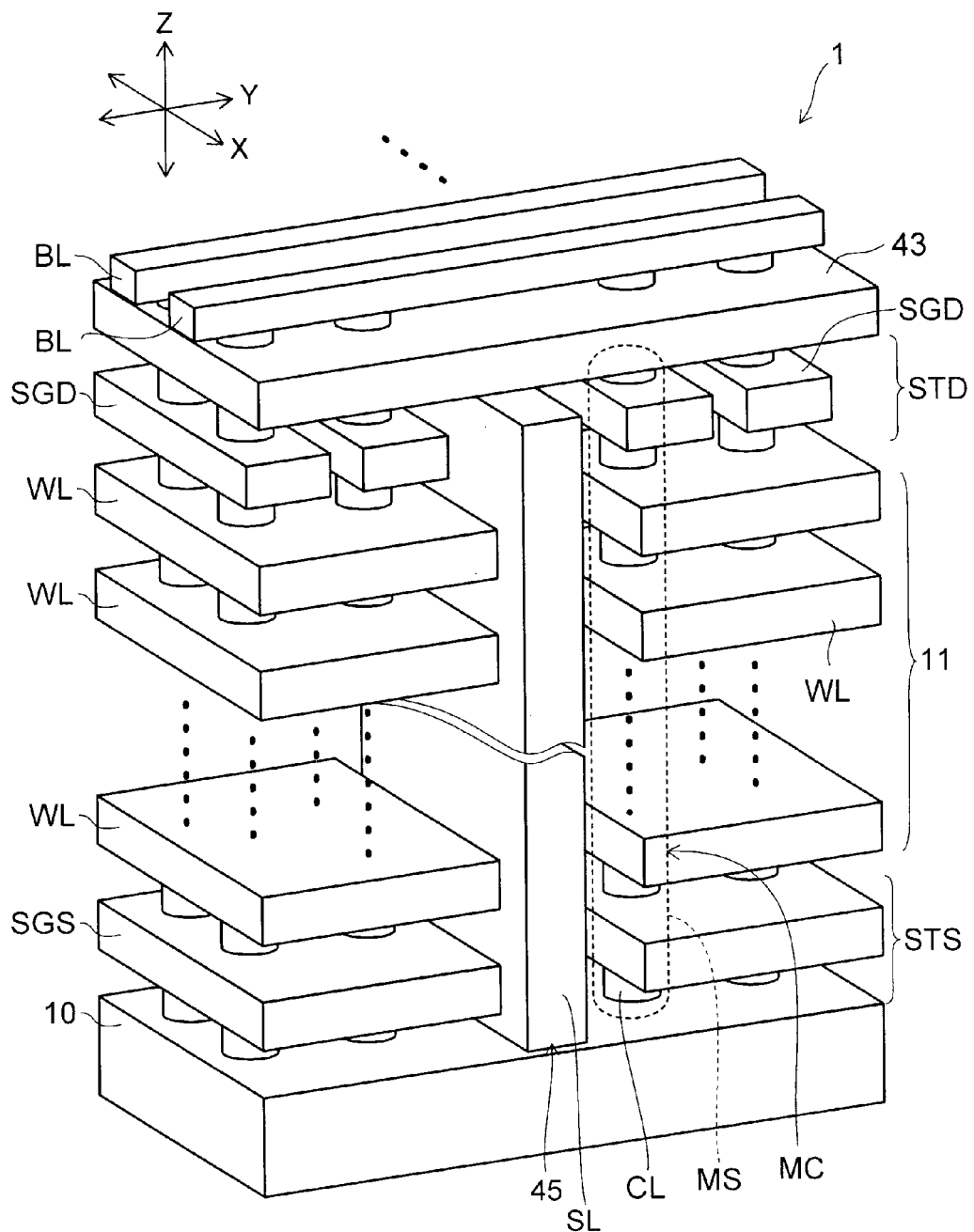
FIG. 1 is a schematic perspective view of a memory cell array of an embodiment.

According to one embodiment, a semiconductor memory device includes a substrate; a stacked body provided on the substrate and including a plurality of electrode layers separately stacked; a first upper layer gate provided on the stacked body; an interlayer insulating layer provided on the first upper layer gate; an insulating part continuously provided from the first upper layer gate to the substrate and extending in a first direction parallel to a major surface of the substrate; a second upper layer gate; a semiconductor part extending from the second upper layer gate to the substrate; a charge storage film provided between the semiconductor part and the plurality of electrode layers; and a semiconductor layer provided from an upper end of the semiconductor part to a portion of the semiconductor part reaching the second upper layer gate. The second upper layer gate is provided on the interlayer insulating layer and the insulating part, and extends on a first surface parallel to the major surface.

Hereinafter, embodiments will be described with reference to the drawings. Incidentally, in the respective drawings, the same components are denoted by the same reference numerals.

FIG. 1 is a schematic perspective view of a memory cell array 1 of an embodiment. Incidentally, in FIG. 1, for making the drawing easy to see, illustration of insulation layers between electrode layers and the like is omitted.

In FIG. 1, two directions orthogonal to each other are an X-direction and a Y-direction, and a direction which is orthogonal to the X-direction and the Y-direction (XY plane) and in which a plurality of electrode layers WL is stacked is a Z-direction (stacking direction).

Figure 2A:
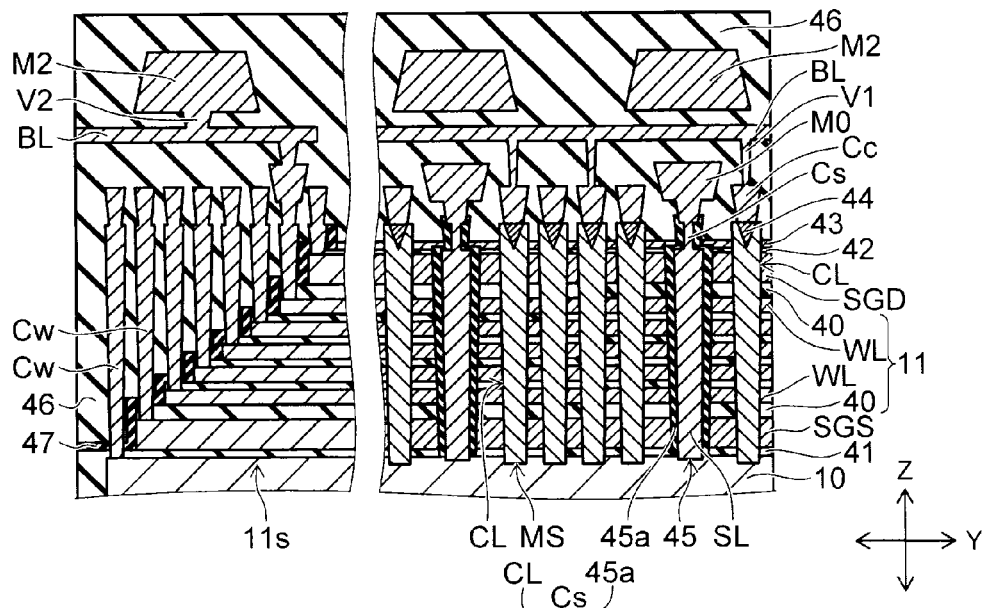
FIG. 2A is a schematic sectional view of a memory string of the embodiment and FIGS. 2B and 2C are schematic plan views of the memory string of the embodiment.
Figure 2B:
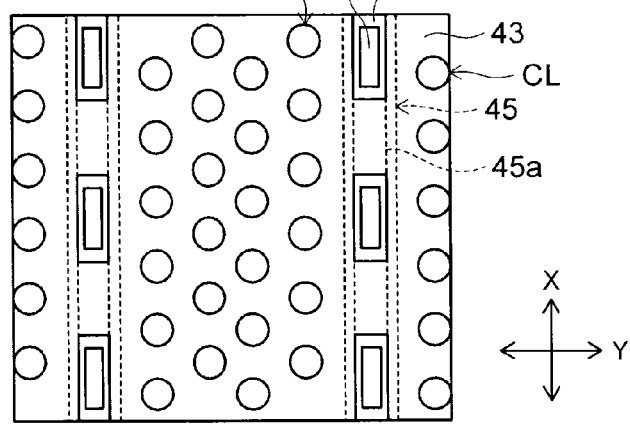

FIG. 2A is a schematic sectional view of a memory string MS and shows a section parallel to a YZ plane of FIG. 1. FIG. 2B is a schematic plan view of the memory string MS and shows a plane parallel to a XY plane on a conductive layer 43 in FIG. 2A. Incidentally, in FIG. 2B, a structure of a stair part 11s in FIG. 2A is omitted.

As shown in FIG. 1, the memory cell array 1 includes the plurality of memory strings MS.

A source side selection gate SGS (lower layer gate) is provided on a substrate 10 through an insulating layer 41. An insulating layer 40 is provided on the source side selection gate SGS, and a stacked body 11 in which a plurality of electrode layers WL and a plurality of insulating layers 40 are alternately stacked is provided on the insulating layer. Incidentally, the layer number of the electrode layers WL shown in the drawing is an example, and the layer number of the electrode layers WL is arbitrary.

The plurality of electrode layers WL is, for example, separately stacked. The insulating layer 40 includes, for example, a gap.

The insulating layer 40 is provided on the uppermost electrode layer WL, and a drain side selection gate SGD (first upper gate) is provided on the insulating layer 40. The drain side selection gate SGD is isolated into a plurality of parts in the Y-direction (first direction) correspondingly to lines of a plurality of columnar parts CL arranged in the X-direction. Each of the drain side selection gates SGD extends in the X-direction (second direction).

The source side selection gate SGS, the drain side selection gate SGD and the electrode layer WL include at least one of metal and metal silicide. Alternatively, the source side selection gate SGS, the drain side selection gate SGD and the electrode layer WL are, for example, silicon layers containing silicon as a main component, and the silicon layers are doped with, for example, boron as an impurity to give conductivity. An insulating film containing, for example, silicon oxide as a main component is used as the insulating layer 40.

The thickness of each of the source side selection gate SGS and the drain side selection gate SGD is thicker than, for example, the thickness of the one electrode layer WL, and for example, the plurality of layers may be provided. Besides, the thickness of each of the source side selection gate SGS and the drain side selection gate SGD may be equal to or thinner than the thickness of the one electrode layer WL. In that case, the plurality of layers may be provided similarly to the above. Incidentally, the "thickness" here is the thickness in the stacking direction (Z-direction) of the stacked body 11.

The stacked body 11 is provided with the columnar parts CL extending in the Z-direction. The columnar parts CL pierce the stacked body 11. The columnar parts CL are formed in, for example, a cylindrical or elliptic cylindrical shape. The columnar parts CL are electrically connected to the substrate 10.

The stacked body 11 is provided with isolation parts 45 (insulating parts) piercing through the stacked body 11 and extending in the X-direction. The isolation parts 45 isolate the stacked body 11 into a plurality of blocks in the Y-direction. An insulating film 45a is provided in the isolation part 45. For example, a source layer SL is provided in the isolation part 45, and a side surface of the source layer SL is covered with the insulating film 45a. A material having conductivity is used as the source layer SL, and for example, at least one of metal, silicon doped with impurity, and metal silicide is used.

A lower end of the source layer SL is electrically connected to a channel body 20 (semiconductor part) of the columnar part CL through the substrate 10. An upper end of the source layer SL is electrically connected to a not-shown peripheral circuit through a metal wiring M0.

For example, the source layer SL may be provided between the substrate 10 and the stacked body 11. At this time, a not-shown contact layer is provided in the isolation part 45, and the source layer SL is electrically connected to the peripheral circuit through the contact layer and the metal wiring M0.

Figure 3A:
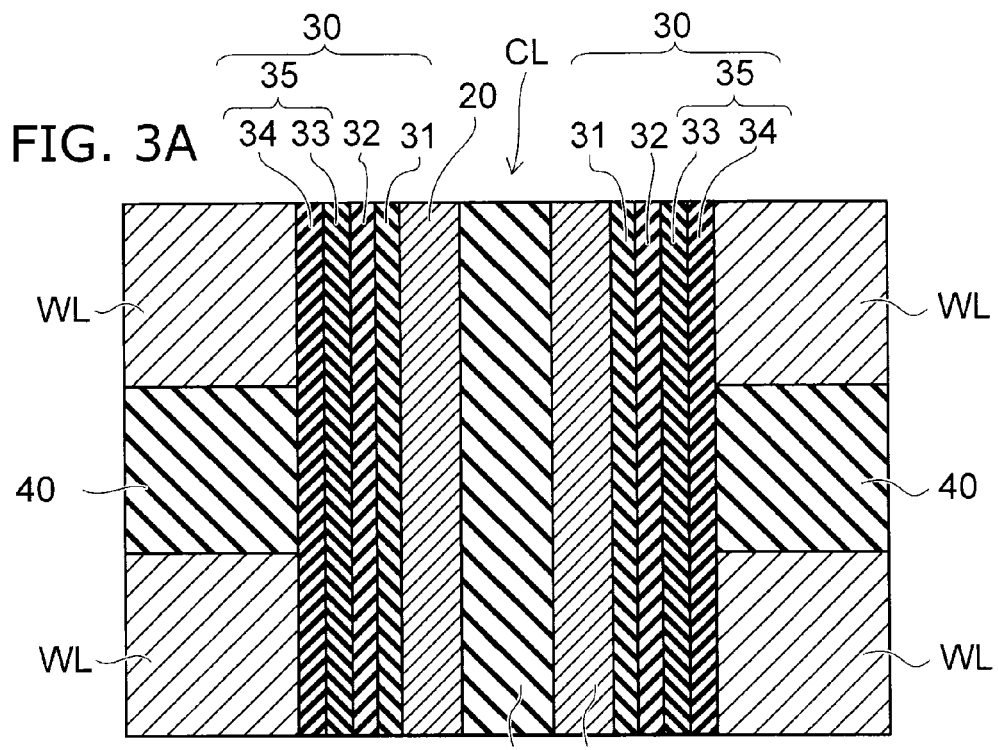
FIGS. 3A and 3B are enlarged schematic sectional views of a part of the columnar section of the embodiment.

FIG. 3A is an enlarged schematic sectional view of a part of the columnar part CL of the embodiment.

Figure 8A:
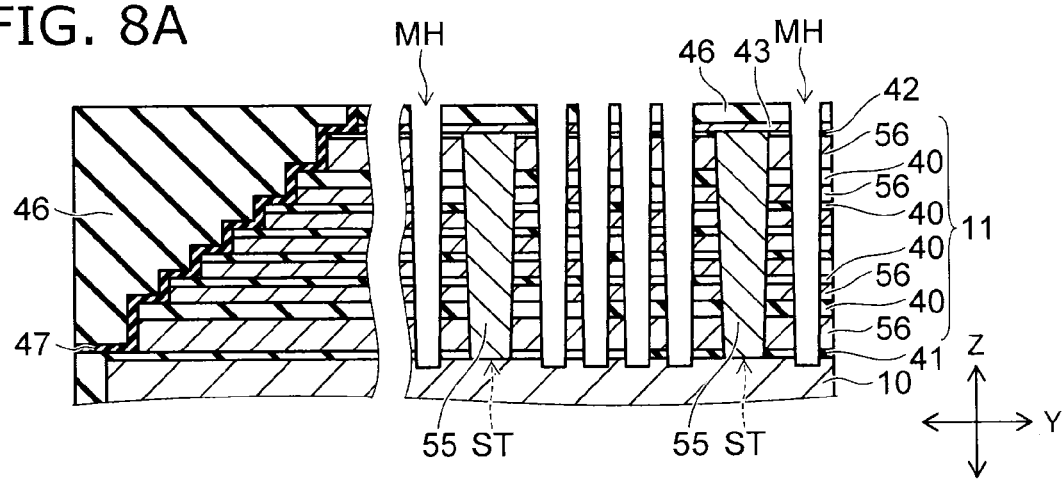

The columnar part CL is formed in a memory hole MH formed in the stacked body 11 including the plurality of electrode layers WL and the plurality of insulating layers 40 (FIG. 8A). The channel body 20 as a semiconductor channel is provided in the memory hole MH. The channel body 20 is, for example, a silicon film containing silicon as a main component.

The channel body 20 is provided in a tube shape extending in the stacking direction of the stacked body 11. An upper end of the channel body 20 is connected to a bit line BL (wiring) shown in FIG. 1 and FIG. 2A, and a lower end of the channel body 20 is connected to the substrate 10. The bit line BL extends in the Y-direction.

A memory film 30 is provided between the electrode layer WL and the channel body 20. The memory film 30 includes a block insulating film 35, a charge storage film 32 and a tunnel insulating film 31.

The block insulating film 35, the charge storage film 32 and the tunnel insulating film 31 are provided sequentially from the electrode layer WL side between the electrode layer WL and the channel body 20. The block insulating film 35 contacts the electrode layer WL, and the tunnel insulating film 31 contacts the channel body 20. The charge storage film 32 is provided between the block insulating film 35 and the tunnel insulating film 31.

The electrode layer WL surrounds the periphery of the channel body 20 through the memory film 30. A core insulating film 50 is provided inside the channel body 20.

The channel body 20 functions as a channel of the memory cell MC, and the electrode layer WL functions as a control gate of the memory cell MC. The charge storage film 32 functions as a data storage layer to store charge injected from the channel body 20. That is, the memory cell MC having a structure in which the control gate surrounds the periphery of the channel is formed at an intersection portion between the channel body 20 and each of the electrode layers WL.

A semiconductor memory device of the embodiment can freely perform erasing and writing of data and can hold the storage content even when the power is turned off.

The memory cell MC is, for example, of a charge trap type. The charge storage film 32 includes many trap sites to capture charges, and is, for example, a silicon nitride film.

The tunnel insulating film 31 becomes a potential barrier when charges are injected from the channel body 20 into the charge storage film 32 or when charges stored in the charge storage film 32 diffuse into the channel body 20. The tunnel insulating film 31 is, for example, a silicon oxide film.

Alternatively, a stacked film having a structure in which a charge trapping layer is sandwiched between a pair of silicon oxide films may be used as the tunnel insulating film 31. When the stacked film is used as the tunnel insulating film 31, the erasing operation is performed at a low electric field as compared with the single layer of the silicon oxide film. For example, the stacked film described above can be made of ONO film. In addition, the charge trapping layer can be, for example, made of a silicon nitride.

The block insulating film 35 prevents the charges stored in the charge storage film 32 from diffusing into the electrode layer WL. The block insulating film 35 includes a cap film 34 provided in contact with the electrode layer WL, and a block film 33 provided between the cap film 34 and the charge storage film 32.

The block film 33 is, for example, a silicon oxide film. A film having a dielectric constant higher than that of silicon oxide is used as the cap film 34, and for example, at least one of a silicon nitride film, an aluminum oxide film, a hafnium oxide film, and a yttrium oxide film is used.

The cap film 34 is provided in contact with the electrode layer WL, so that back tunnel electrons injected from the electrode layer WL at erasing can be suppressed. That is, the charge blocking property can be enhanced by using the stacked film of the silicon oxide film and the silicon nitride film as the block insulating film 35.

When data is written in the memory cell MC, a writing potential Vprog (for example, about 20V) is applied to the electrode layer WL of the memory cell MC which is a writing object. A pass potential (or an intermediate potential) Vpass (for example, about 10V) lower than Vprog is applied to the electrode layer WL of the memory cell MC which is not a writing object. By this, the intensity of an electric field applied to the charge storage film 32 becomes high only in the memory cell MC of the writing object.

As shown in FIG. 1, a drain side selection transistor STD is provided on an upper end part of the columnar part CL in the memory string MS, and a source side selection transistor STS is provided at a lower end part.

The memory cell MC, the drain side selection transistor STD and the source side selection transistor STS are vertical transistors in which current flows in the stacking direction (Z-direction) of the stacked body 11.

The drain side selection gate SGD functions as the gate electrode (control gate) of the drain side selection transistor STD. An insulating film functioning as a gate insulating film of the drain side selection transistor STD is provided between the drain side selection gate SGD and the channel body 20.

The source side selection gate SGS functions as the gate electrode (control gate) of the source side selection transistor STS. An insulating film functioning as a gate insulating film of the source side selection transistor STS is provided between the source side selection gate SGS and the channel body 20.

The plurality of memory cells MC in which the electrode layers WL of the respective layers are control gates is provided between the drain side selection transistor STD and the source side selection transistor STS.

The plurality of memory cells MC, the drain side selection transistor STD and the source side selection transistor STS are connected in series through the channel body 20, and constitute one memory string MS. The plurality of memory strings MS is arranged in the X-direction and the Y-direction, so that the plurality of memory cells is three-dimensionally provided in the X-direction, the Y-direction and the Z-direction.

Figure 3B:
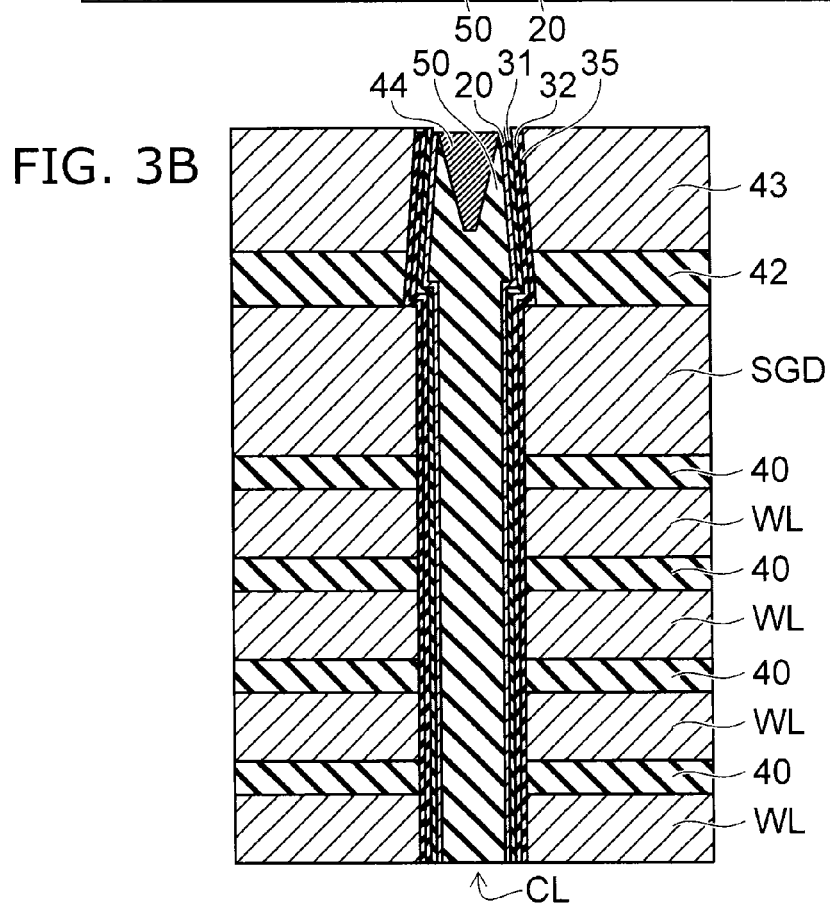

FIG. 3B is an enlarged schematic sectional view of the columnar part CL of the embodiment.

As shown in FIG. 2A and FIG. 3B, an interlayer insulating layer 42 is provided on the drain side selection gate SGD. The conductive layer 43 (second upper layer gate) is provided on the interlayer insulating layer 42.

As shown in FIG. 2B, the conductive layer 43 is provided also on the isolation part 45, extends on the XY plane parallel to the major surface of the substrate 10, and is commonly provided between the plurality of blocks isolated by the isolation part 45. The conductive layer 43 is not isolated by the isolation part 45. The conductive layer 43 is not divided but extends on the stacked body 11 and the isolation part 45. The columnar part CL pierces the conductive layer 43. Thus, the columnar part CL is surrounded by the conductive layer 43.

Figure 2C:
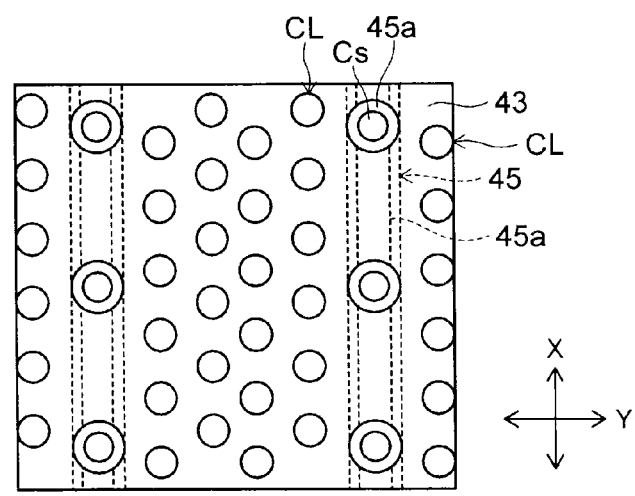

A contact part Cs piercing the conductive layer 43 and reaching the isolation part 45 is provided on the isolation part 45. The contact part Cs is electrically connected to the source layer SL of the isolation part 45. When viewed from the Z-direction, the shape of the contact part Cs is, for example, square (Liner shape), and may be, for example, circular (Hole shape) as shown in FIG. 2C. The contact parts Cs are separated and provided in the X-direction. The number of the contact parts Cs and the interval therebetween are arbitrary.

As shown in FIG. 3B, a semiconductor layer 44 (diffusion layer) is provided in a portion piercing the conductive layer 43 of the columnar part CL. The position of a bottom of the semiconductor layer 44 is higher than the position of an upper surface of the interlayer insulating layer 42 (the position of an interface between the conductive layer 43 and the interlayer insulating layer 42). The semiconductor layer 44 is separated from the conductive layer 43 and the drain side selection gate SGD, and contacts the channel body 20.

For example, silicon doped with impurity is used as the semiconductor layer 44. The impurity concentration of the semiconductor layer 44 is higher than the impurity concentration of the channel body 20. The bottom of the semiconductor layer 44 contacts, for example, the core insulating film 50. As shown in FIG. 2A, a contact part Cc is provided on the upper surface of the semiconductor layer 44, and the semiconductor layer 44 is electrically connected to the bit line BL through the contact part Cc.

The diameter of the upper end of the portion of the columnar part CL piercing the conductive layer 43 is smaller than, for example, the diameter of the portion of the columnar part CL piercing the interlayer insulating layer 42. The side surface of the columnar part CL of the portion surrounded by the conductive layer 43 and the interlayer insulating layer 42 is formed in a so-called reverse taper shape.

According to the semiconductor memory device of the embodiment, the transistor constituting the memory cell MC in which the electrode layer WL is the control gate has a state (erasing state) in which the threshold voltage is relatively low and a state (writing state) in which the threshold voltage is relatively high. A GIDL (Gate Induced Drain Leakage) current generated in the channel at the selection gate (drain side selection gate SGD) end is used in the erasing operation of data.

For example, a high voltage is applied to the semiconductor layer 44 to generate a high electric field in a depletion layer formed between the drain side selection gate SGD and the semiconductor layer 44. By this, tunneling between bands occurs, and generated holes are supplied to the channel body 20, so that the channel potential is raised. The potential of the electrode layer WL is made, for example, ground potential (0 V), so that electrons of the charge storage film 32 are extracted by the potential difference between the channel body 20 and the electrode layer WL, or holes are injected into the charge storage film 32, and the erasing operation is performed.

At this time, for example, when the distance between the drain side selection gate SGD and the semiconductor layer 44 is long, the GIDL is not generated. On the other hand, when the distance between the drain side selection gate SGD and the semiconductor layer 44 is short, the current of the drain side selection transistor STD can not be cut off.

According to the embodiment, the conductive layer 43 is provided on the drain side selection gate SGD through the interlayer insulating layer 42. By this, as in a manufacturing method described later, the distance between the drain side selection gate SGD and the semiconductor layer 44 can be adjusted by the thickness of the interlayer insulating layer 42. The accuracy at which the thickness of the interlayer insulating layer 42 is formed is higher than the accuracy at which the embedded depth of the semiconductor layer 44 is controlled by recessing the core insulating film 50. Thus, the distance between the drain side selection gate SGD and the semiconductor layer 44 can be provided at high accuracy, and the adjustment of the amount of current generated by the GIDL and suppression of off-current can be performed. That is, the improvement of machining accuracy of the memory and the high reliability can be realized.

At the erasing operation time, for example, a voltage of +20 V is applied to the semiconductor layer 44, and a voltage lower than the voltage applied to the semiconductor layer 44, for example, +10 V is applied to the drain side selection gate SGD. At this time, a voltage higher than the voltage applied to the semiconductor layer 44, for example, a voltage of 27 V is applied to the conductive layer 43. By this, holes are injected from the semiconductor layer 44 into the channel body 20.

Further, according to the embodiment, the shape of the portion of the columnar part CL piercing the conductive layer 43 and the interlayer insulating layer 42 is the reverse taper shape. By this, the accuracy in the depth direction in which the semiconductor layer 44 is formed can be improved, and the improvement of machining accuracy of the memory and the high reliability can be realized.

For example, the not-shown peripheral circuit includes a transistor to apply a specific voltage to the conductive layer 43. By this, when the memory cell MC is erased, the voltage for generating the GIDL in the conductive layer 43 can be applied.

In addition to the above, according to the embodiment, the contact parts Cs electrically connected to the isolation part 45 are separated and provided on the isolation part 45 in the X direction. Thus, the common conductive layer 43 can be integrally provided among the plurality of blocks, and a process of machining the conductive layer 43 is not required to be increased. By this, the machining accuracy of the memory and the high reliability can be realized without increasing a manufacturing process.

Next, the manufacturing method of the semiconductor memory device of the embodiment will be described with reference to FIG. 4 to FIG. 18B.

FIG. 4, FIG. 5A, FIG. 6A, FIG. 7, FIG. 8A to FIG. 9A, FIG. 10A, FIG. 11A to FIG. 12A, FIG. 13A, FIG. 14A to FIG. 15A, FIG. 16A, FIG. 17A and FIG. 18A are schematic sectional views of the semiconductor memory device of the embodiment. FIG. 5B, FIG. 6B, FIG. 9B, FIG. 10B, FIG.

12B, FIG. 13B, FIG. 15B, FIG. 16B, FIG. 17B and FIG. 18B are schematic plan views of the semiconductor memory device of the embodiment.

Figure 4:
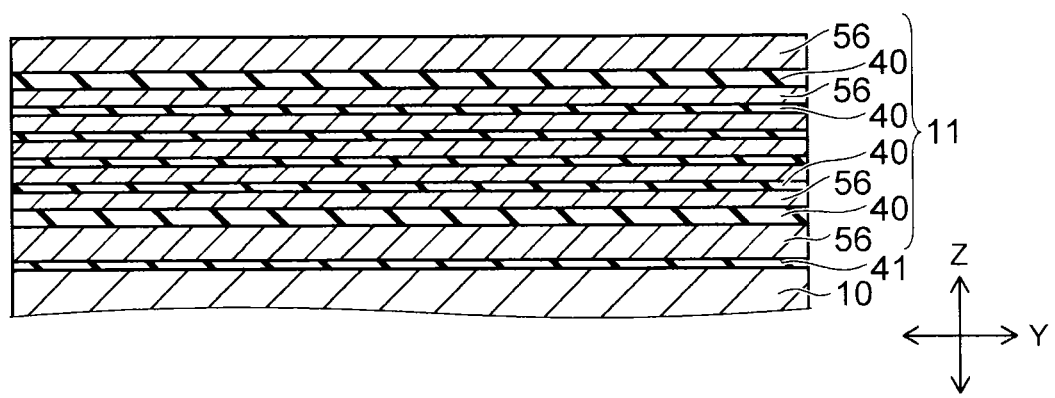
FIG. 4 to FIG. 18B are schematic sectional views showing a method for manufacturing the semiconductor memory device of the embodiment.

As shown in FIG. 4, the stacked body 11 in which a first layer 56 (sacrificial layer) and the insulating layer 40 (second layer) are alternately stacked is formed on the substrate 10 through the insulating layer 41. For example, a silicon nitride film is used as the first layer 56. At this time, the first layer 56 is removed by an after-mentioned method, and the electrode layer WL is formed in the place where the first layer 56 is removed.

The first layer 56 is not limited to the sacrificial layer which is removed, and a material including silicon and having conductivity may be used as the electrode layer WL from the first, or a material including metal may be used. At this time, the source side selection gate SGS is formed in the lowermost layer of the stacked body 11, and the drain side selection gate SGD is formed in the uppermost layer of the stacked body 11. In this case, the first layer 56 may not be removed.

Figure 5A:
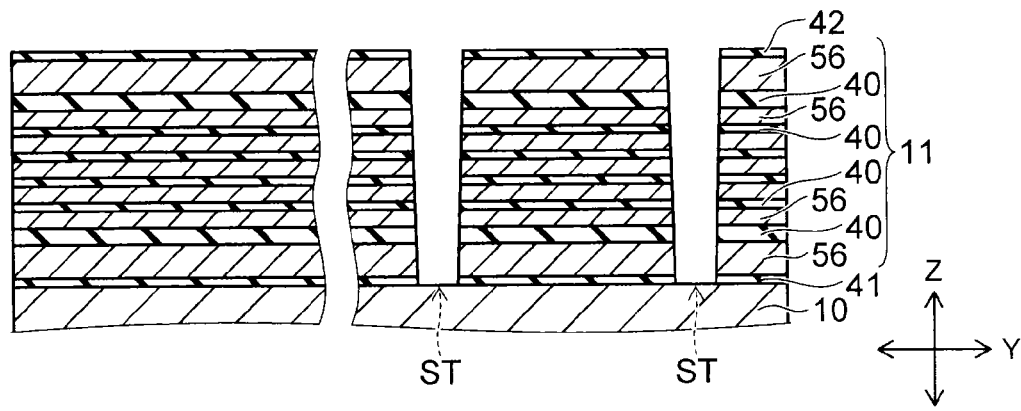

As shown in FIG. 5A, the interlayer insulating layer 42 is formed on the stacked body 11. Slits ST piercing the interlayer insulating layer 42 and the stacked body 11 and reaching the substrate 10 are formed in the stacked body 11. As a method of forming the slits ST, for example, an RIE method (Reactive Ion Etching) using a not-shown mask is used.

Figure 5B:
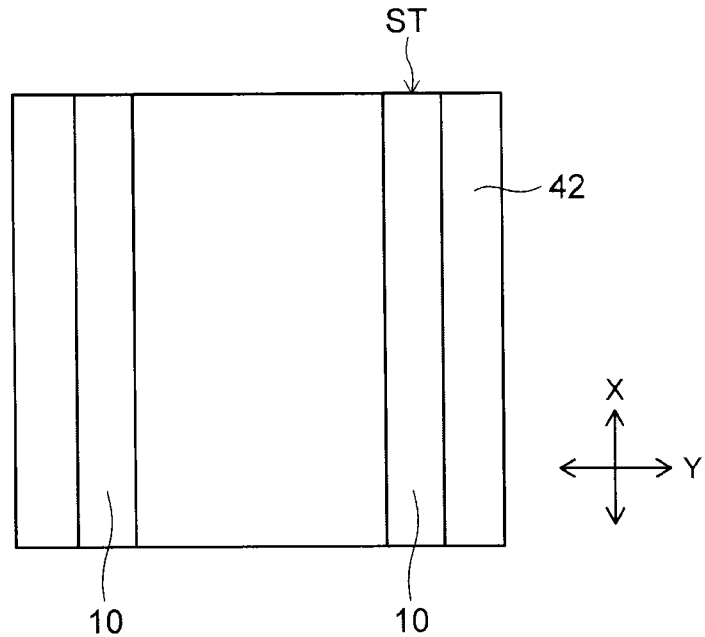

As shown in FIG. 5B, the slits ST extend in the X-direction and are separated in the Y-direction. The substrate 10 is exposed at bottoms of the slits ST.

Figure 6A:
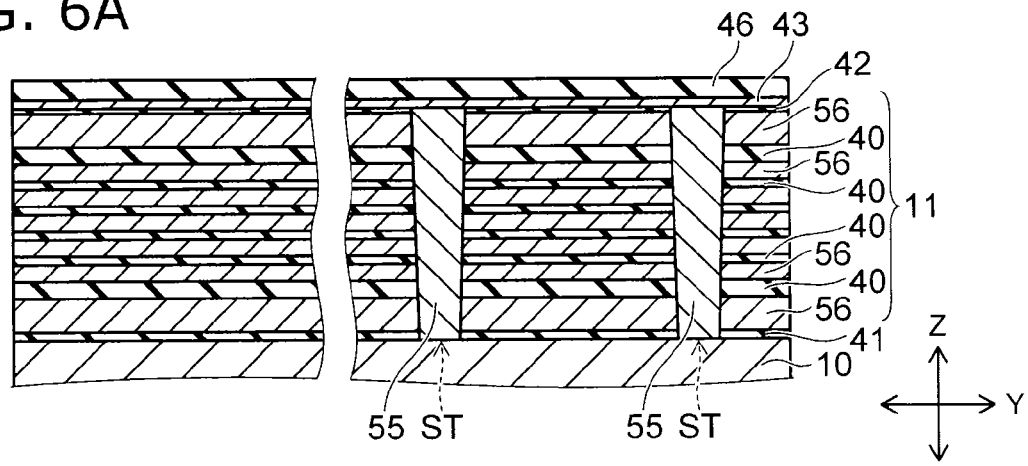

As shown in FIG. 6A, a sacrificial film 55 is formed in the slit ST. The sacrificial film 55 is embedded from the lower end to the upper end of the slit ST. As the sacrificial film 55, for example, a silicon nitride film, an amorphous silicon film or a metal film and the like is used.

Figure 6B:
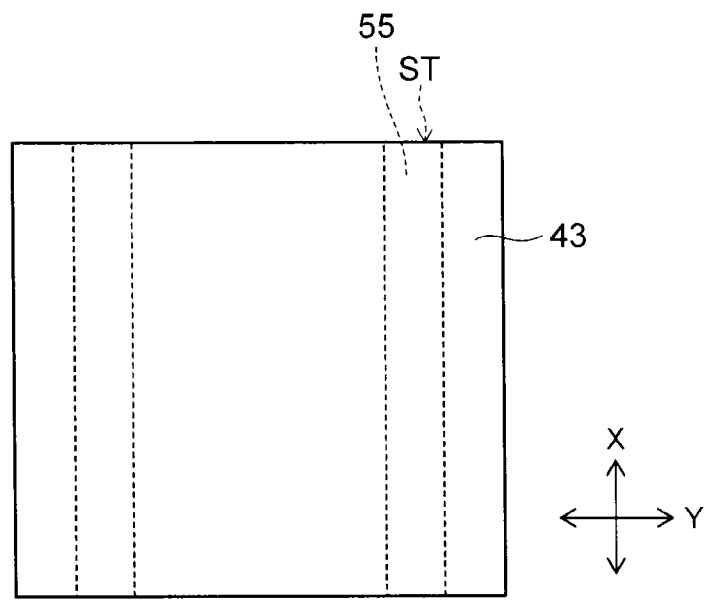

The conductive layer 43 is integrally formed on the XY plane and on the interlayer insulating layer 42 and the sacrificial film 55 (FIG. 6B). An insulating layer 46 is formed on the conductive layer 43. As the insulating layer 46, for example, at least one of a silicon oxide film and a silicon nitride film is used.

Figure 7:
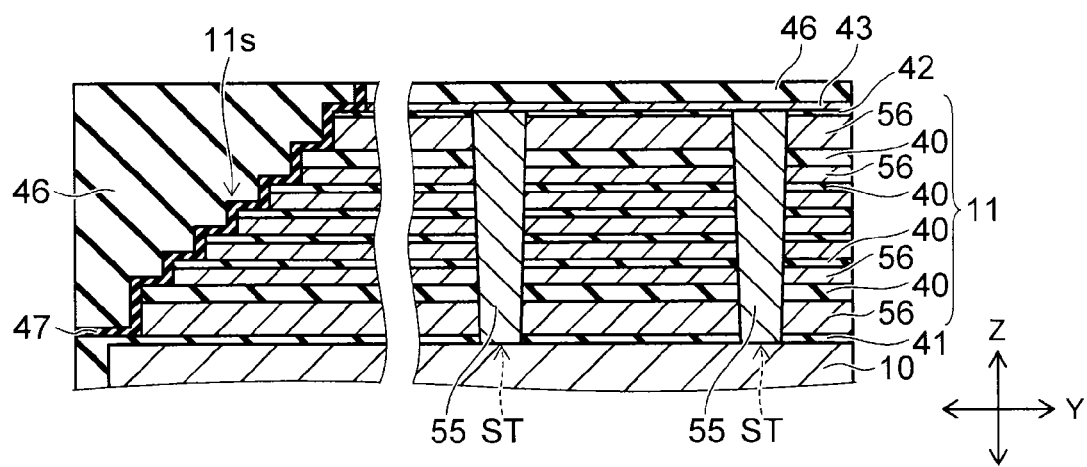

As shown in FIG. 7, a stair part 11s in which upper surfaces of the insulating layers 40 are exposed is formed in a region where the slit ST of the stacked body 11 is not formed. In the stair part 11s, for example, upper surfaces of the first layers 56 may be exposed. An insulating layer 47 is formed on the surface of the stair part 11s, and the insulating layer 46 is formed on the insulating layer 47. The insulating layer 46 is integrally formed from an upper part of the stair part 47 to an upper part of the conductive layer 43. The insulating layer 40 and the insulating layer 46 are, for example, silicon oxide films. The insulating layer 47 is a film of a material different from the insulating layer 40 and the insulating layer 46, for example, a silicon nitride film. The insulating layer 47 functions as an etching stopper when the contact hole is formed in the stair part 11s.

As shown in FIG. 8A, the memory hole MH piercing the insulating layer 46 and the stacked body 11 and reaching the substrate 10 is formed. At this time, for example, the diameter of the memory hole MH piercing the upper end of the conductive layer 43 is smaller than the diameter of the memory hole MH piercing the lower end of the interlayer insulating layer 42. That is, the memory hole MH is formed in the reverse taper shape.

Next, the memory film 30 shown in FIG. 3A is formed on the inner wall (side surface and bottom surface) of the memory hole MH. Thereafter, the memory film 30 formed on the bottom surface of the memory hole MH is removed, and the memory hole MH reaching the substrate 10 is again formed. The channel body 20 is formed on the inside of the memory film 30 and the inner wall of the memory hole MH reaching the substrate 10, and the columnar part CL is formed. For example, the core insulating film 50 may be formed on the inside of the channel body 20.

Figure 8B:
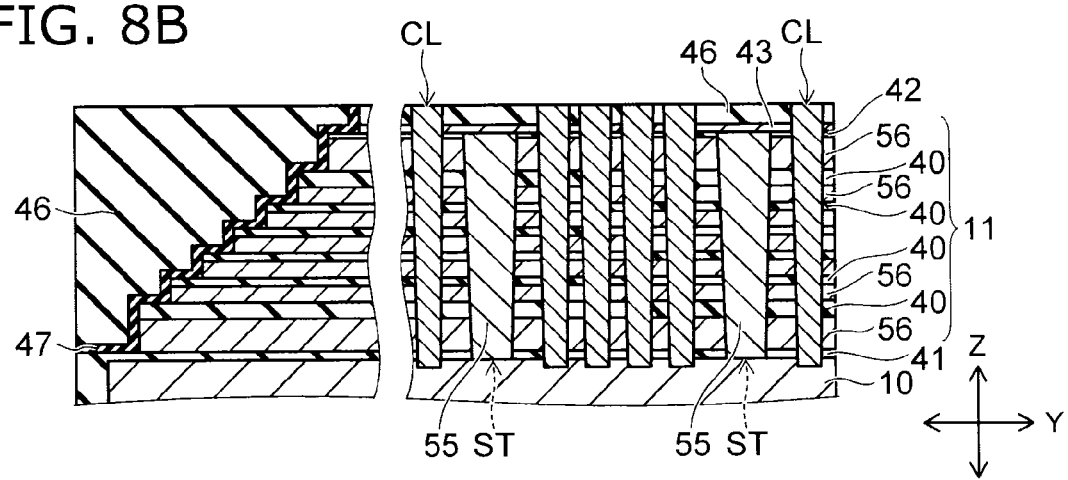

By this, the columnar part CL is formed as shown in FIG. 8B. The columnar part CL pierces the insulating layer 46 and the stacked body 11 and reaches the substrate 10. The number of the columnar parts CL and the arrangement thereof are arbitrary.

The columnar part CL pierces the conductive layer 43, and the plurality of columnar parts CL is formed in a mesh shape in the conductive layer 43. Thus, even after the columnar parts CL are formed, the conductive layer 43 is not divided but is integrally formed.

Figure 9A:
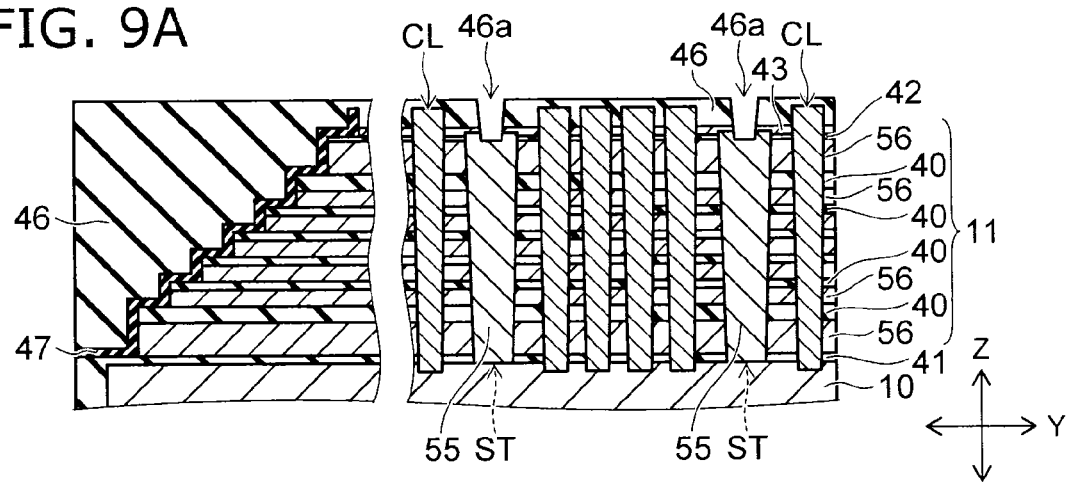

As shown in FIG. 9A, the insulating layer 46 is formed on the columnar part CL. By this, the side surface and the upper surface of the columnar part CL formed higher than the conductive layer 43 are covered with the insulating layer 46. A through part 46a (groove or hole) piercing the insulating layer 46 and the conductive layer 43 and reaching the sacrificial film 55 is formed on the slit ST. For example, an ME method using a not-shown mask is used as a method of forming the through part 46a.

Figure 9B:
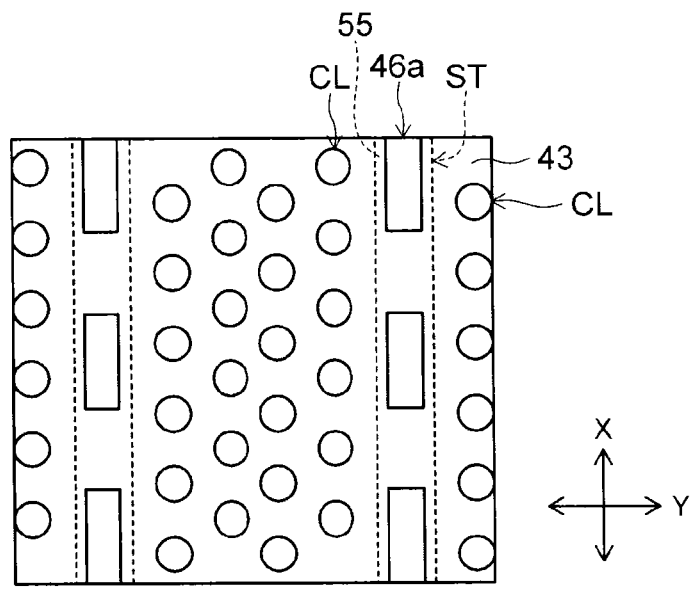

As shown in FIG. 9B, the plurality of through parts 46a is formed on the slits ST, and are separated in the X-direction and the Y-direction. That is, the through parts 46a are formed in a mesh shape. Thus, even after the through parts 46a are formed, the conductive layer 43 is not divided but is integrally formed. When viewed from the Z-direction, the shape of the through part 46a is, for example, square (Liner shape), and may be, for example, circular (Hole shape). The number of the through parts 46a and the interval therebetween are arbitrary.

Figure 10A:
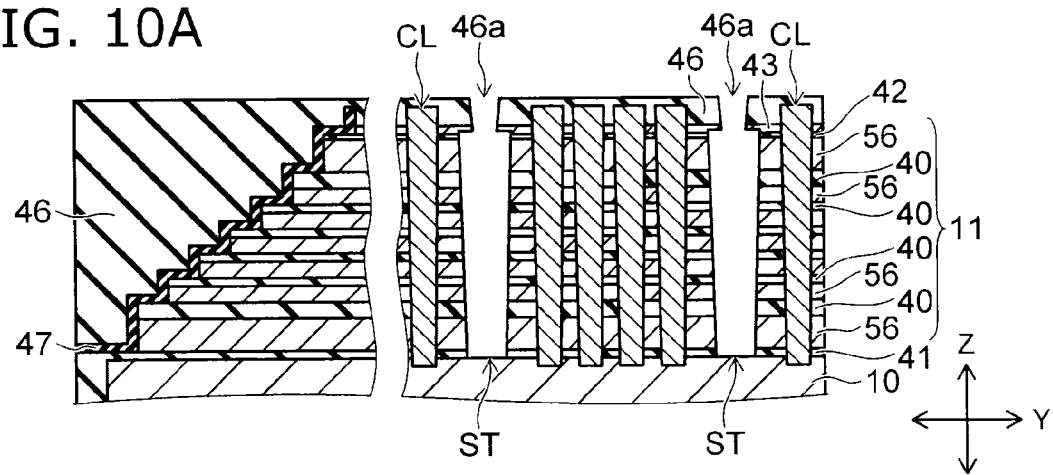
Figure 10B:
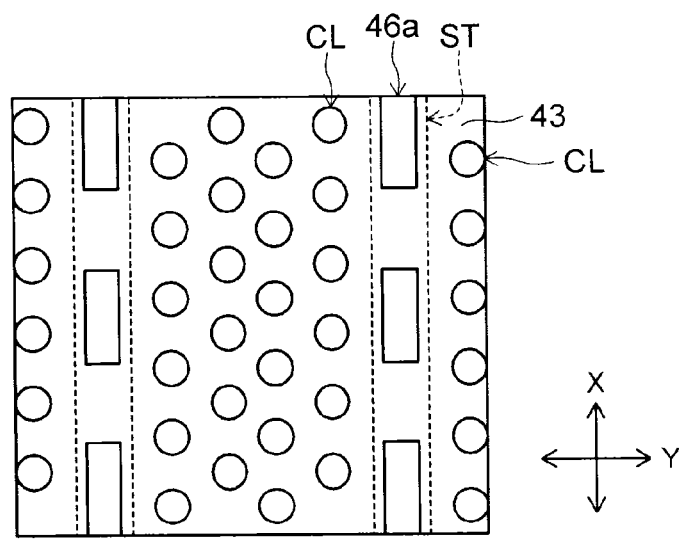

As shown in FIG. 10A, the sacrifice sacrificial film 55 in the slit ST is removed through the through part 46a. For example, a wet etching method is used as a method of removing the sacrificial film 55. By this, the substrate 10 is exposed at the bottom surface of the slit ST. The first layer 56 and the insulating layer 40 are respectively exposed at the side surface of the slit ST.

Figure 11A:
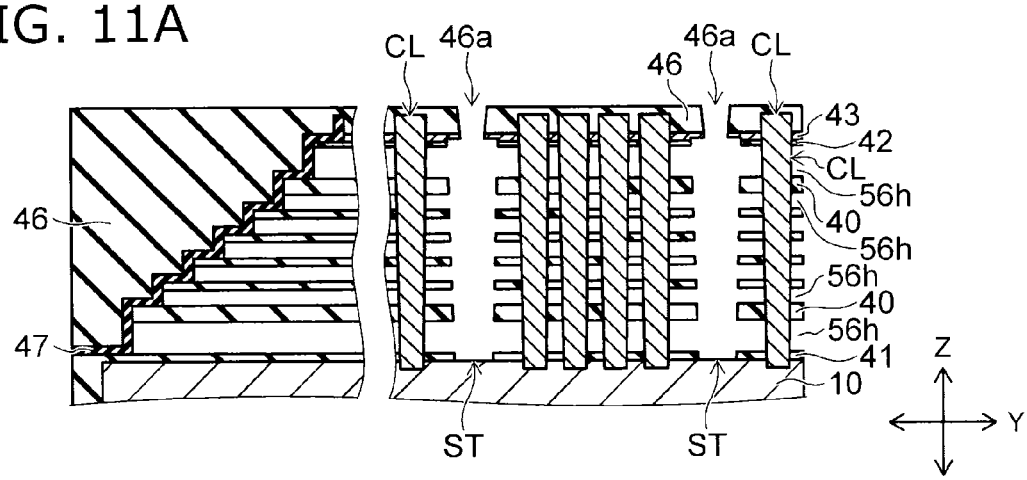

As shown in FIG. 11A, the first layers 56 are removed through the through parts 46a and the slits ST. By this, spaces 56h are formed between the respective insulating layers 40.

Figure 11B:
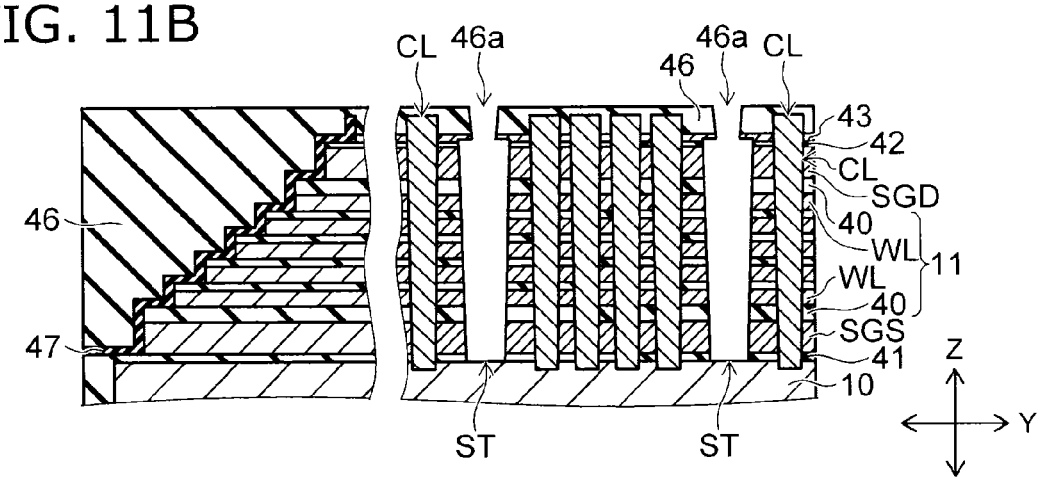

As shown in FIG. 11B, the electrode layers WL, the source side selection gate SGS and the drain side selection gate SGD are respectively formed in the spaces 56h between the respective insulating layers 40. A metal is used as the electrode layers WL, the source side selection gate SGS and the drain side selection gate SGD. Alternatively, for example, silicon having conductivity may be used as the electrode layers WL, the source side selection gate SGS and the drain side selection gate SGD.

At this time, the source side selection gate SGS is formed in the space 56h formed by removing the lowermost first layer 56 of the stacked body 11. The drain side selection gate SGD is formed in the space 56h formed by removing the uppermost first layer 56 of the stacked body 11.

Incidentally, as described above, when at least one of the material including metal and the material including silicon and having conductivity is used as the first layer 56, the first layer 56 may not be removed. At this time, the electrode layer WL in FIG. 11B is the same as the first layer 56.

For example, when silicon is used as the electrode layer WL, the electrode layer WL can be subjected to metal silicide processing through the through part 46a and the slit ST.

As a method of the metal silicide processing, for example, a metal film (for example, titanium) is conformally formed on the side wall of the through part 46a and the slit ST, and high temperature annealing is performed. By this, the silicon included in each of the electrode layer WL, the drain side selection gate SGD and the source side selection gate SGS reacts with the metal included in the metal film. Then, metal silicide parts are formed in the electrode layer WL, the drain side selection gate SGD and the source side selection gate SGS adjacent to the slit ST. Thereafter, non-reacted metal is removed.

Figure 12A:
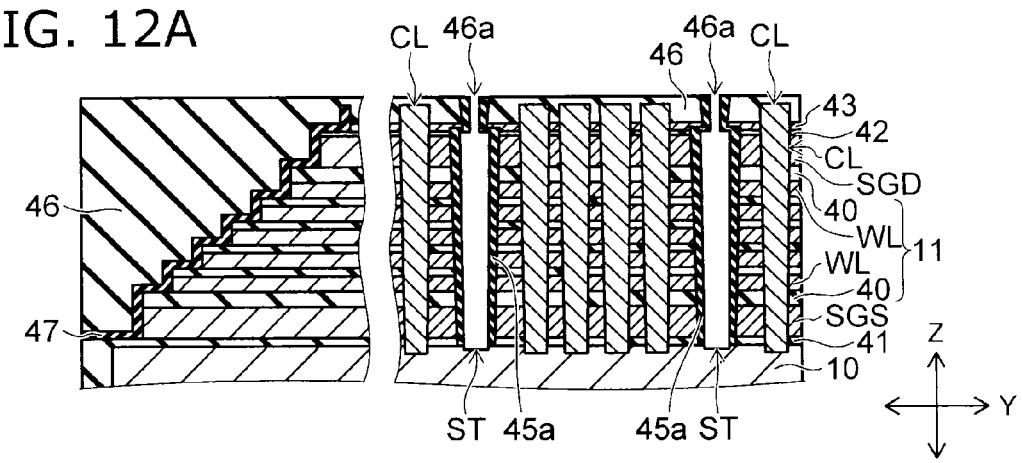
Figure 12B:
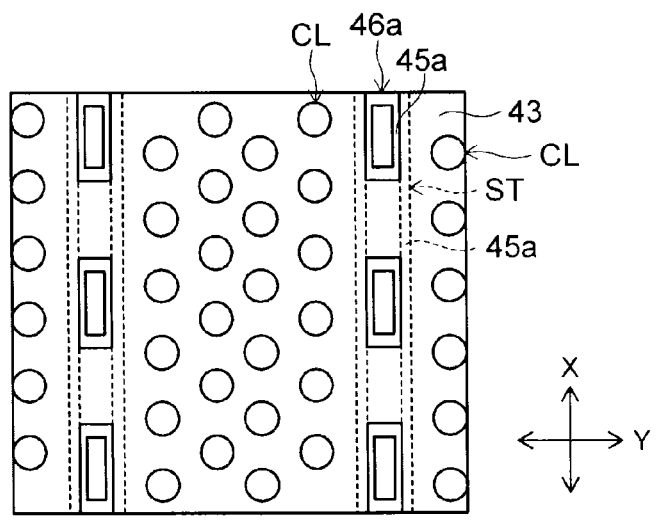

As shown in FIG. 12A, the insulating film 45a is conformally formed on the side wall of the through part 46a and the slit ST. By this, each of the electrode layer WL, the drain side selection gate SGD and the source side selection gate SGS exposed in the slit ST is covered with the insulating film 45a.

Figure 13A:
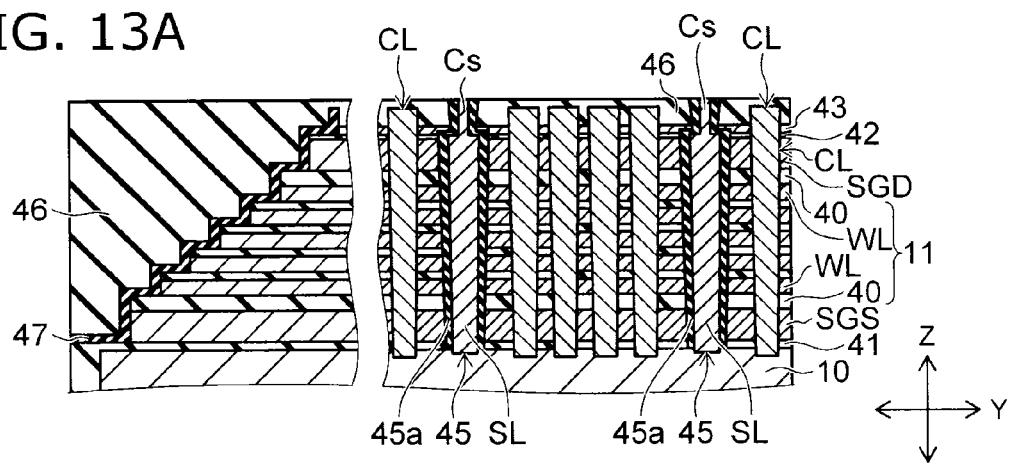

As shown in FIG. 13A, the conductive film is formed inside the insulating film 45a, thereby the source layer SL and the contact part Cs are integrally formed. The source layer SL is disposed in the slit ST. The contact part Cs is disposed in the through part 46a. For example, metal is used as the conductive film, or at least one of, for example, silicon including impurity and silicon including metal silicide may be used.

Figure 13B:
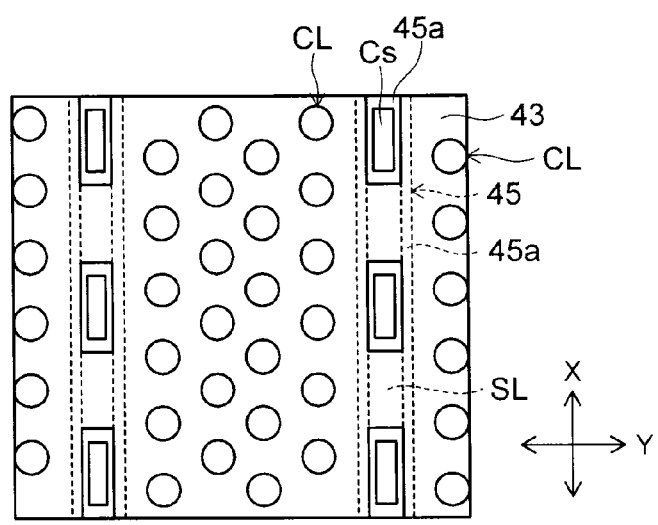

The source layer SL and the contact part Cs are electrically connected to the substrate 10. By this, the source layer SL and the contact part Cs are electrically connected to the channel body 20 of the columnar part CL through the substrate 10. As shown in FIG. 13B, the source layer SL is formed under the conductive layer 43 and extends in the X-direction.

Figure 14A:
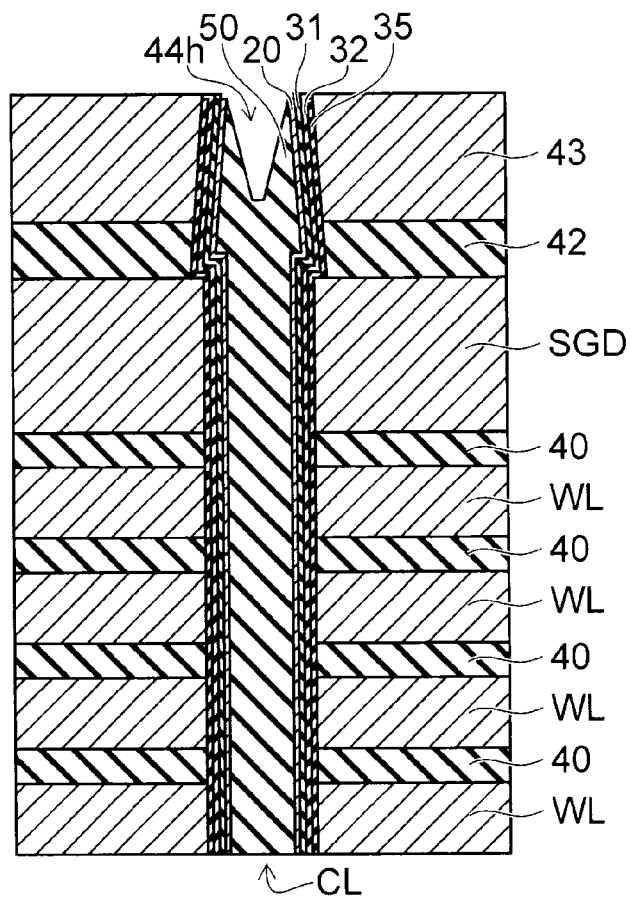

As shown in FIG. 14A, a cavity 44h piercing the insulating layer 46 and reaching the columnar part CL is formed. The cavity 44h is formed from the upper end of the columnar part CL to a portion of the columnar part CL surrounded by the conductive layer 43. The cavity 44h is formed by, for example, recessing the upper surface of the core insulating film 50 in the columnar part CL to a depth not reaching the drain side selection gate SGD. At this time, a variation in the depth direction when the cavity 44h is formed falls within the range of the thickness of the conductive layer 43.

Figure 14B:
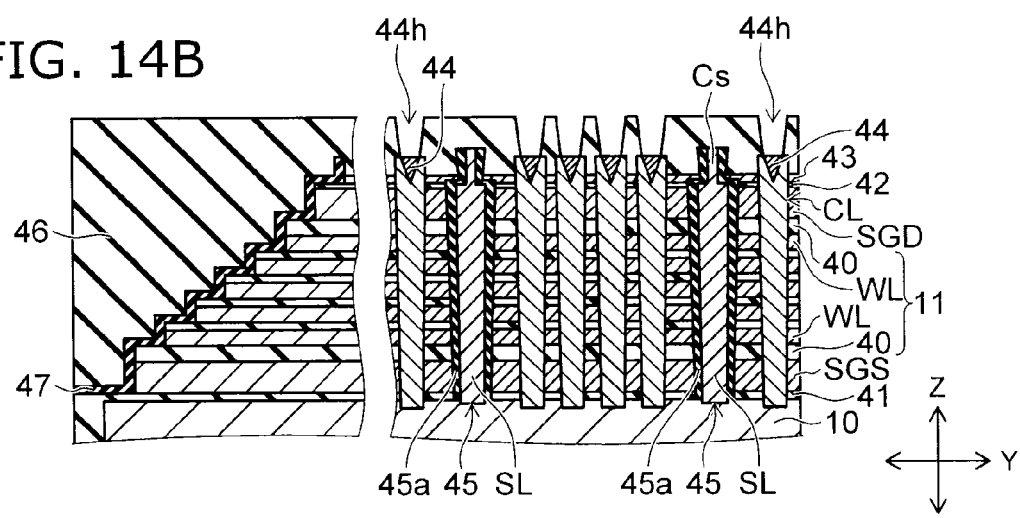

As shown in FIG. 14B, the semiconductor layer 44 is formed in a portion of the cavity 44h reaching the columnar part CL. At this time, the bottom of the semiconductor layer 44 is formed in a portion of the columnar part CL surrounded by the conductive layer 43. That is, the lower end of the semiconductor layer 44 is positioned higher than the interface between the conductive layer 43 and the interlayer insulating layer 42.

For example, silicon doped with impurity is used as the semiconductor layer 44. The semiconductor layer 44 is electrically connected to the channel body 20. The bottom surface of the semiconductor layer 44 contacts, for example, the core insulating film 50, and may contact, for example, the channel body 20. The impurity concentration of the semiconductor layer 44 is higher than the impurity concentration of the channel body 20.

Figure 15A:
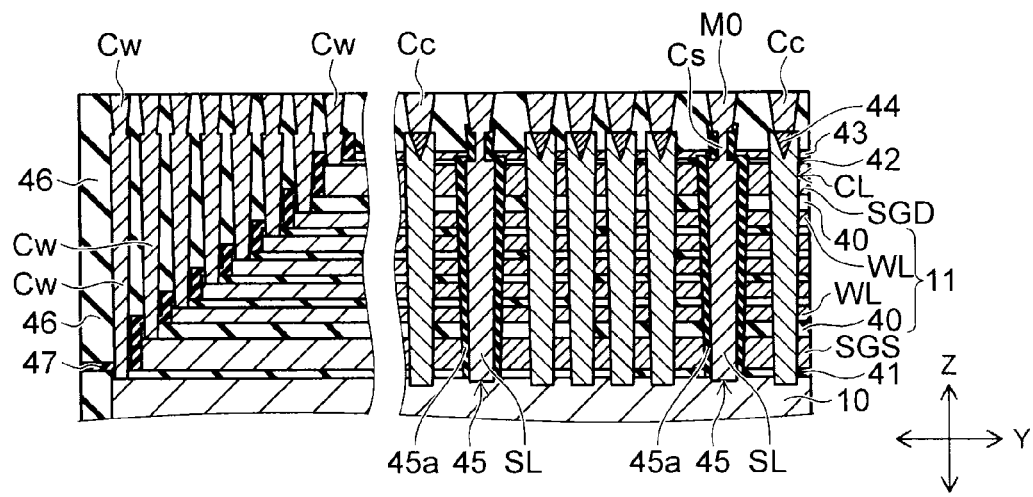
Figure 15B:
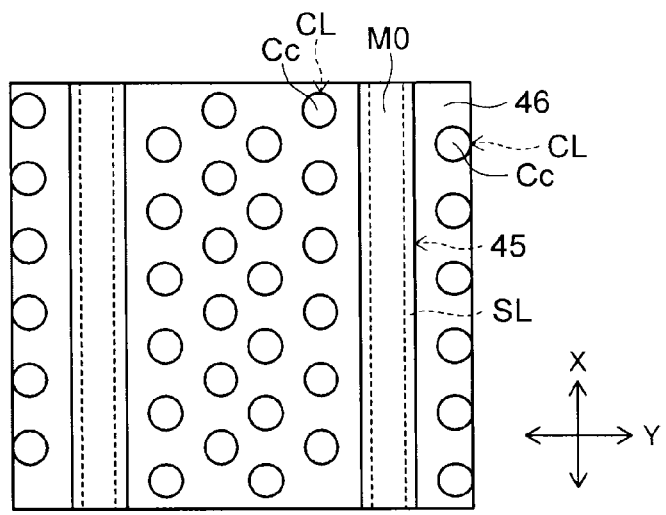

As shown in FIG. 15A, the contact part Cc piercing the insulating layer 46 and reaching the semiconductor layer 44 is formed on the columnar part CL. Contact parts Cw piercing the insulating layers 46 and 47 and reaching the electrode layers WL are formed on the stair part 11s. The metal wiring M0 is formed on the source layer SL through the contact part Cs. As shown in FIG. 15B, the metal wiring M0 extends in the X-direction similarly to the source layer SL.

Figure 16A:
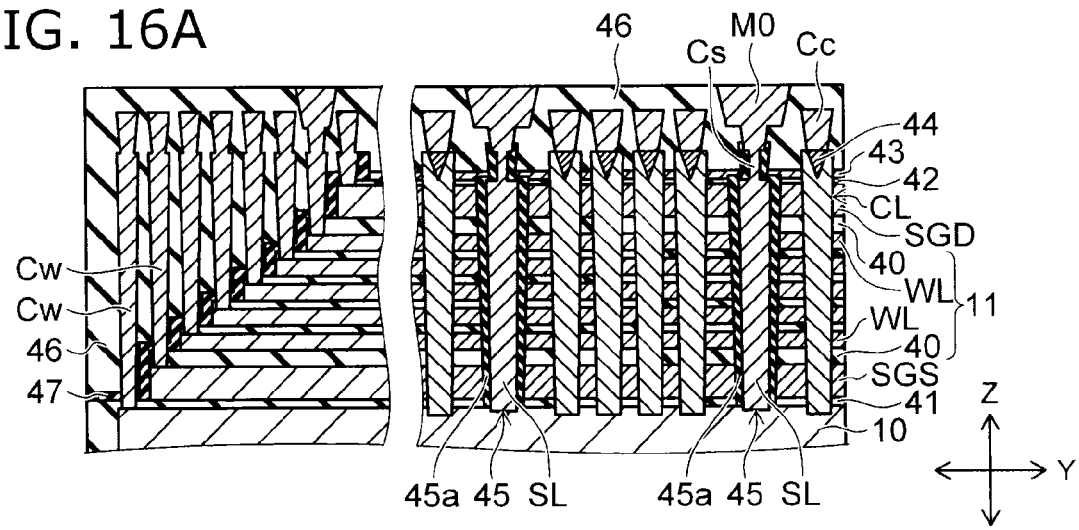
Figure 16B:
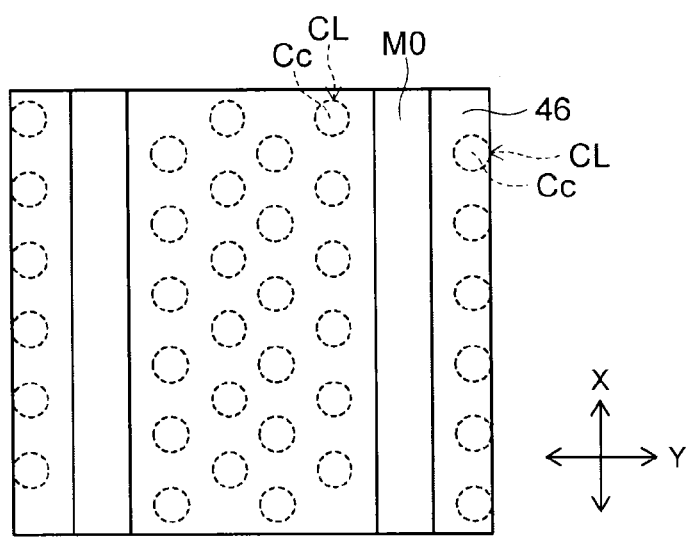

As shown in FIG. 16A and FIG. 16B, the metal wiring M0 the width of which is widened in the Y-direction is further formed. This enables easy formation of a contact to the metal wiring M0.

Figure 17A:
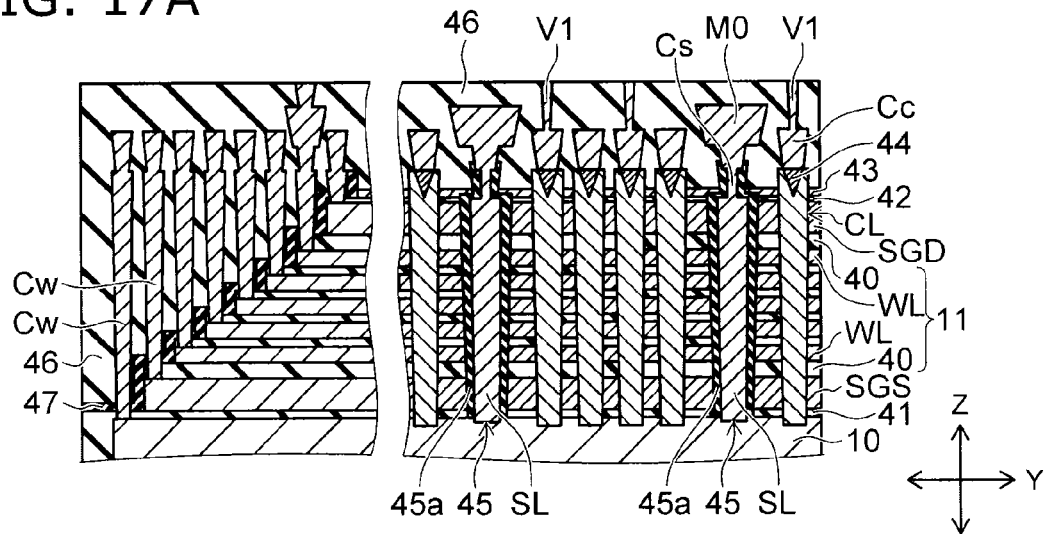
Figure 17B:
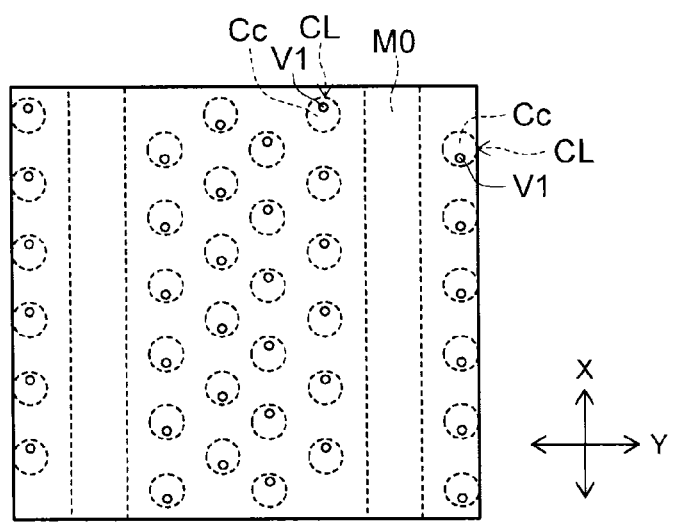

As shown in FIG. 17A and FIG. 17B, a via V1 is formed on the columnar part CL through the contact part Cc. The diameter of the via V1 is smaller than the diameter of the contact part Cc.

Figure 18A:
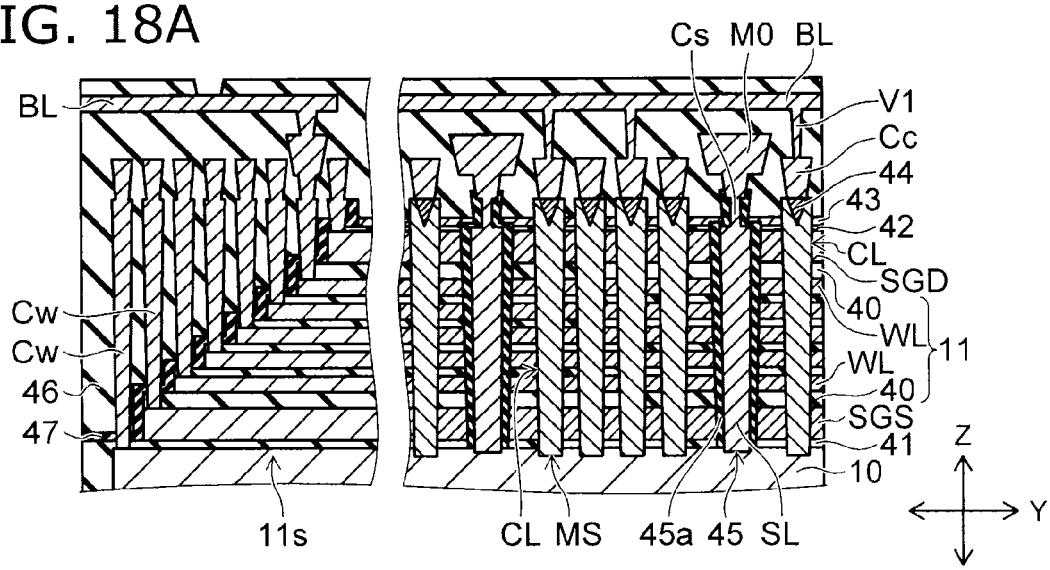
Figure 18B:
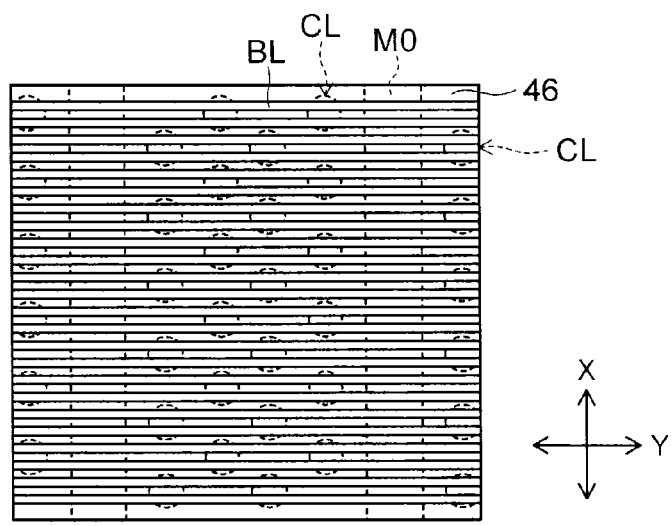

As shown in FIG. 18A and FIG. 18B, the bit line BL is formed on the via V1. The bit line BL extends in the Y-direction, and the plurality of bit lines is formed. The bit line BL is electrically connected to, for example, one of the columnar parts CL surrounded by the isolation parts 45. The number of the bit lines BL is arbitrary.

Thereafter, a metal wiring M2 is formed on the bit line BL through a via V2, and the semiconductor memory device shown in FIG. 2A is formed.

According to the embodiment, the conductive layer 43 is formed on the drain side selection gate SGD through the interlayer insulating layer 42. The width (thickness) of the conductive layer 43 in the stacking direction is larger than the width of the variation when the core insulating film 50 is recessed by an etching method and the depth which the cavity 44h reaches is controlled. Thus, when the semiconductor layer 44 is formed in the columnar part CL, the bottom surface of the semiconductor layer 44 can be formed in the portion of the columnar part CL surrounded by the conductive layer 43. At this time, the distance between the semiconductor layer 44 and the drain side selection gate SGD can be adjusted by the thickness of the interlayer insulating layer 42.

The thickness of the interlayer insulating layer 42 can be controlled with higher accuracy than the depth of the cavity 44h formed by etching the columnar part CL. Thus, according to the embodiment, the distance between the semiconductor layer 44 and the drain side selection gate SGD can be adjusted by the formation accuracy of the thickness of the interlayer insulating layer 42. That is, the accuracy of adjustment of the distance between the semiconductor layer 44 and the drain side selection gate SGD is improved, and the improvement of machining accuracy of the memory and the high reliability can be realized.

Further, according to the embodiment, the shape of the portion of the columnar part CL where the semiconductor layer 44 is formed is the reverse taper shape. Thus, in the etching of the columnar part CL, an etching rate of a portion corresponding to an upper portion of the semiconductor layer 44 is higher than an etching rate of a portion corresponding to a lower portion of the semiconductor layer 44. By this, the time required when the vicinity of the upper end of the columnar part CL is etched can be shortened. Further, the accuracy when the etching of the columnar part CL is ended is improved. That is, the accuracy of formation of the distance between the semiconductor layer 44 and the drain side selection gate SGD can be further improved, and the improvement of machining accuracy of the memory and the high reliability can be realized.

Figure 19:
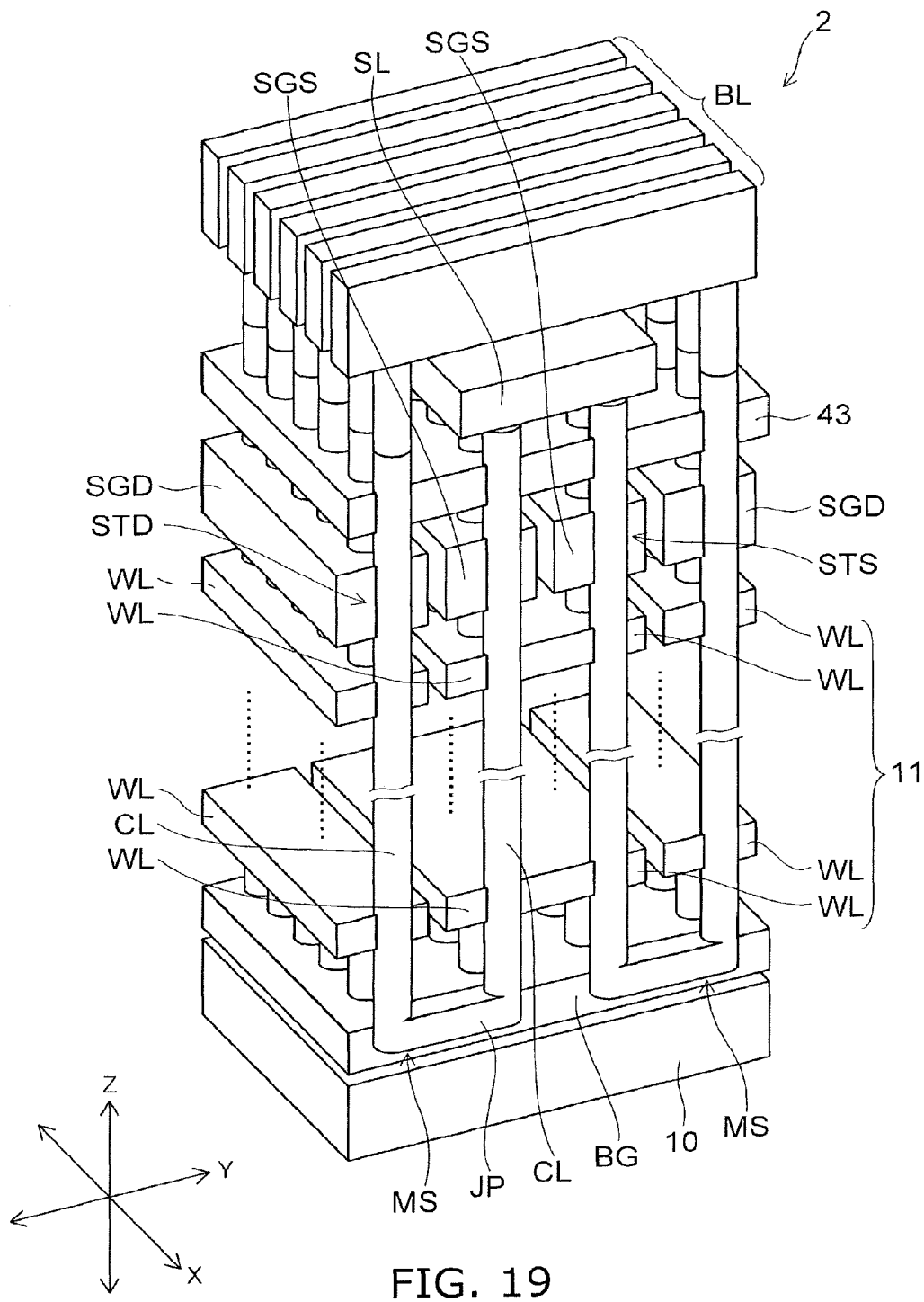
FIG. 19 is a schematic perspective view of the memory cell array of another embodiment.

FIG. 19 is a schematic perspective view of a memory cell array 2 according to another example of the semiconductor memory device of the embodiment. Incidentally, also in FIG. 19, similarly to FIG. 1, in order to make the drawing easy to see, the illustration of insulating layers and the like is omitted.

A back gate BG is provided on a substrate 10 through an insulating layer. A stacked body 11 in which a plurality of electrode layers WL and a plurality of insulating layers 40 are alternately stacked is provided on the back gate BG.

A memory string MS is formed into a U-shape having a pair of columnar parts CL extending in a Z-direction and a coupling part JP to couple respective lower ends of the pair of columnar parts CL. The columnar part CL is formed into, for example, a cylindrical or elliptic cylindrical shape, pierces through the stacked body, and reaches the back gate BG.

A drain side selection gate SGD is provided on an upper end part of one of the pair of columnar parts CL in the U-shaped memory string MS, and a source side selection gate SGS is provided on an upper end part of the other. The drain side selection gate SGD and the source side selection gate SGS are provided on the uppermost electrode layer WL through the insulating layer 40.

The drain side selection gate SGD and the source side selection gate SGS are isolated in a Y-direction by an isolation part. The stacked body below the drain side selection gate SGD and the stacked body below the source side selection gate SGS are isolated in the Y-direction by the isolation part. That is, the stacked body between the pair of columnar parts CL of the memory string MS is isolated in the Y-direction by the isolation part.

A source layer SL is provided on the source side selection gate SGS through an insulating layer. A plurality of bit lines BL is provided on the drain side selection gate SGD and the source layer SL through an insulating layer. The respective bit lines BL extend in the Y-direction.

Also in the memory cell array 2 shown in FIG. 19, similarly to the foregoing embodiment, a conductive layer 43 is provided on the selection gates (on the drain side selection gate SGD and the source side selection gate SGS) through an interlayer insulating layer 42. By this, formation accuracy of distance between a semiconductor layer 44 provided on the upper part of the columnar part CL and the selection gate can be improved, and the improvement of machining accuracy of the memory and the high reliability can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
    a substrate;
    a stacked body provided on the substrate and including a plurality of electrode layers separately stacked;
    a first upper layer gate provided on the stacked body;
    an interlayer insulating layer provided on the first upper layer gate;
    an insulating part continuously provided from the first upper layer gate to the substrate and extending in a first direction parallel to a major surface of the substrate;
    a second upper layer gate provided on the interlayer insulating layer and the insulating part, and extending on a first surface parallel to the major surface;
    a semiconductor part extending from the second upper layer gate to the substrate, the semiconductor part being insulated from the second upper layer gate;
    a charge storage portion provided between the semiconductor part and one of the plurality of electrode layers; and
    a semiconductor layer provided from an upper end of the semiconductor part to a portion of the semiconductor part reaching the second upper layer gate, the semiconductor layer being disposed inside the semiconductor part, a lower end of the semiconductor layer being located higher than an interface between the second upper layer gate and the interlayer insulating layer.

2. The semiconductor memory device according to claim 1, wherein a maximum diameter of a section of the upper end of the semiconductor part parallel to the major surface of the substrate is smaller than a maximum diameter of a section of a portion of the semiconductor part adjacent to the interlayer insulating layer and parallel to the major surface.

3. The semiconductor memory device according to claim 1, wherein
    the insulating part includes a source layer electrically connected to the substrate; and
    the semiconductor memory device further comprises a plurality of contact parts extending from the second upper layer gate to the source layer, and separated and provided in the first direction.

4. The semiconductor memory device according to claim 3, wherein as viewed in a stacking direction of the stacked body, a shape of each of the plurality of contact parts is circular.

5. The semiconductor memory device according to claim 3, wherein as viewed in a stacking direction of the stacked body, a shape of each of the plurality of contact parts is square.

6. The semiconductor memory device according to claim 1, wherein the semiconductor layer is separated from the second upper layer gate.

7. The semiconductor memory device according to claim 1, further comprising an insulating film provided inside the semiconductor part, wherein
    an upper surface of the insulating film contacts the semiconductor layer.

8. The semiconductor memory device according to claim 1, wherein a thickness of the first upper layer gate is thicker than a thickness of the plurality of electrode layers.

9. The semiconductor memory device according to claim 1, wherein an impurity concentration of the semiconductor layer is higher than an impurity concentration of the semiconductor part.

* * * * *